United States Patent [19]
Andrade

[11] 4,400,636
[45] Aug. 23, 1983

[54] THRESHOLD VOLTAGE TOLERANT LOGIC

[75] Inventor: Thomas L. Andrade, Oakton, Va.

[73] Assignee: IBM Corporation, Armonk, N.Y.

[21] Appl. No.: 213,440

[22] Filed: Dec. 5, 1980

[51] Int. Cl.³ .............. H03K 19/094; H03K 19/003; H03K 19/12; H03K 19/20
[52] U.S. Cl. .................................. 307/446; 307/443; 307/450; 307/571
[58] Field of Search .............. 307/443, 446, 448, 450, 307/442, 475, 457–458, 570, 571, 317 A

[56] References Cited

U.S. PATENT DOCUMENTS

| | | | |
|---|---|---|---|
| 3,703,650 | 11/1972 | Kendall | 307/310 |
| 3,806,742 | 4/1974 | Powell | 307/304 |
| 3,969,632 | 7/1976 | Bobenrieth | 307/205 |
| 3,970,875 | 7/1976 | Leehan | 307/304 |
| 3,975,649 | 8/1976 | Kawagoe et al. | 307/304 |
| 4,016,434 | 4/1977 | DeFilippi | 307/297 |
| 4,049,980 | 9/1977 | Maitland | 307/304 |
| 4,112,314 | 9/1978 | Gani et al. | 307/317 A X |
| 4,142,114 | 2/1979 | Green | 307/304 |
| 4,208,595 | 6/1980 | Gladstein et al. | 307/297 |
| 4,300,064 | 11/1981 | Eden | 307/450 X |

FOREIGN PATENT DOCUMENTS 55-88380  7/1980  Japan ........................... 307/458

OTHER PUBLICATIONS

Suzuki et al., "Logic Circuits with 2 µm Gate Schottky Barrier FETs", Proc. of 6th *Conf. on Solid State Devices*, Tokyo, Jap.; 1974, pp. 219–224.

Nuzillat et al., "A Subnanosecond Integrated Switching Circuit with MESFET's for LSI"; *IEEE JSSC*, vol. SC-11, No. 3, pp. 385–394; 6/1976.

Richard C. Eden, et al., "The Prospects for Ultrahigh--Speed VLSI GaAs Digital Logic," *IEEE Journal of Solid-State Circuits*, vol. SC-14, No. 2, Apr. 1979, pp. 221–239.

*Primary Examiner*—Larry N. Anagnos
*Attorney, Agent, or Firm*—Maurice H. Klitzman

[57] ABSTRACT

A logic gate is disclosed employing enhancement mode MESFET gallium arsenide devices which do not require the tight process control necessary in the prior art because two such devices are employed in the gate circuit to mutually compensate for the effects of their equal deviation from nominal threshold voltages.

12 Claims, 3 Drawing Figures

THRESHOLD VOLTAGE TOLERANT LOGIC

FIELD OF THE INVENTION

The invention disclosed broadly relates to semiconductor technology and more particularly relates to an improvement in semiconductor logic gates.

BACKGROUND OF THE INVENTION

Logic gates employing enhancement mode Schottky diode metal semiconductor gate (MESFET) gallium arsenide (GaAs) devices are difficult to fabricate in production quantities because of variations in their threshold voltages which must be overcome by very tight control in order to fabricate uniform, very thin active channel layers, so that they are totally depleted at zero gate bias voltage and yet give good device transconductance when the device is turned on. A description of such devices and their method of manufacture may be found in the publication by R. C. Eden, et al., "The Prospects for Ultrahigh-Speed VLSI GaAs Digital Logic," *IEEE Journal of Solid-State Circuits*, Vol. SC-14, No. 2, April 1979, pages 221–239.

OBJECTS OF THE INVENTION

It is therefore an object of the invention to provide an improved enhancement mode Schottky diode metal-semiconductor gate device.

It is still a further object of the invention to provide an improved logic gate embodied in enhancement mode Scottky diode MESFET technology, which is easier to fabricate than in the prior art.

It is still a further object of the invention to provide an improved logic gate of enhancement mode Schottky diode metal-semiconductor gate gallium arsenide devices, which do not require uniform, very thin active channel layers.

SUMMARY OF THE INVENTION

These and other objects, features and advantages of the invention are accomplished by the threshold voltage tolerant logic disclosed herein. A logic gate is disclosed employing enhancement mode MESFET gallium arsenide devices which do not require the tight process control required in the prior art, because two such devices are employed in the gate circuit to mutually compensate for the effects of their equal deviation from nominal threshold voltages.

DESCRIPTION OF THE FIGURES

These and other objects, features and advantages of the invention will be more fully appreciated with reference to the accompanying figures.

DISCUSSION OF THE PREFERRED EMBODIMENT

Problem: Logic gates employing enhancement mode Schottky diode metal-semiconductor gate (MESFET) gallium arsenide (GaAs) devices are difficult to fabricate in production quantities because of variations in their threshold voltages which must be overcome by very tight control in order to fabricate uniform, very thin active channel layers, so that they are totally depleted at zero gate bias voltage and yet give good device transconductance when the device is turned on.

Solution: A logic gate is disclosed employing enhancement mode MESFET GaAs devices which do not require the tight process control because two such devices are employed in the gate circuit to mutually compensate for the effects of their equal deviation from nominal threshold voltages.

Figure 1:
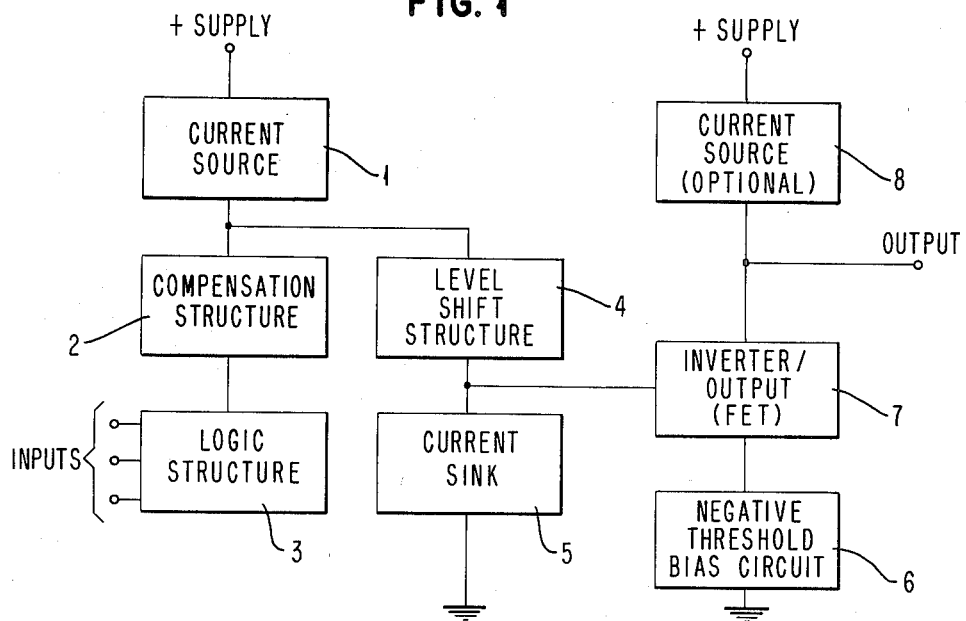
FIG. 1 is a block diagram of the functions performed by the elements in the threshold voltage tolerant logic invention.
Figure 2:
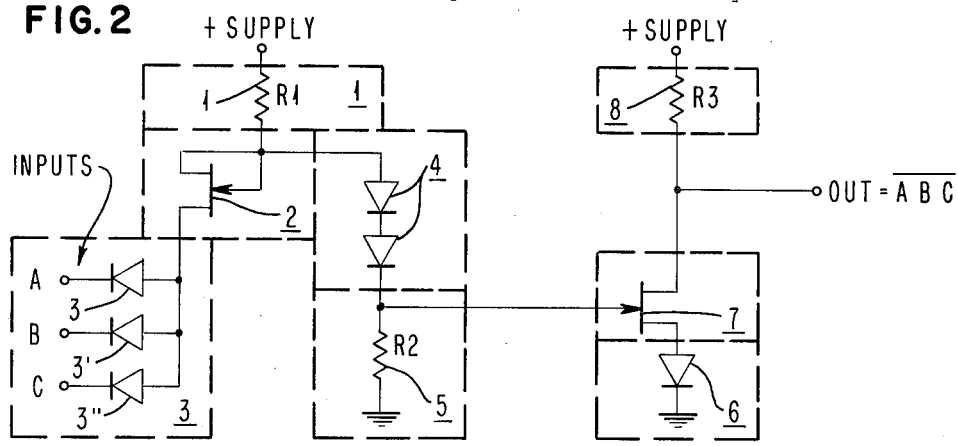
FIG. 2 is a functional NAND gate circuit employing the threshold voltage tolerant logic invention.

FIG. 1 shows a functional block diagram of the NAND gate circuit shown in FIG. 2 employing the inventive concept wherein the MESFET device 2 and the MESFET device 7 both have the same theshold voltage since they are formed in mutually close proximity on the integrated circuit chip. When either A, B or C is down, the MESFET device 2 will conduct current through the resistor $R_1$ and the iR drop will be applied through the level shifting diodes 4 to the gate of the MESFET device 7. Both devices 2 and 7 are enhancement mode devices and when the voltage on the gate of device 7 is at the down level due to the iR drop in the resistor $R_1$, the MESFET device 7 should be off and therefore a reduced current will flow through the load resistor $R_3$ and a relatively high output voltage will be present at the output node. Alternately if each of the inputs A, B and C is at the high level, there should be no conduction through the device 2 and therefore the voltage on the gate of device 7 should be high causing it to conduct current from the load resistor $R_3$ resulting in a low logic level signal at the output node.

When the threshold voltage of devices 2 and 7 is relatively high with respect to the nominal value, the quantity of current which device 2 will conduct is reduced and this causes the potential applied to the gate of the device 7 to be higher than the nominal value and this should compensate for the correspondingly higher threshold voltage of device 7.

The circuit described in FIGS. 1 and 2 minimizes the effects of device threshold voltages on logic levels. This technique is especially useful for MESFET devices operated near zero volts threshold. A significant feature of the invention is the use of the device input section to compensate for threshold voltage shifts in the output inverter section. The embodiment shown in FIG. 2 will tolerate either positive or negative threshold voltages on the compensation MESFET device 2 or the inverter/output MESFET device 7.

Figure 3:
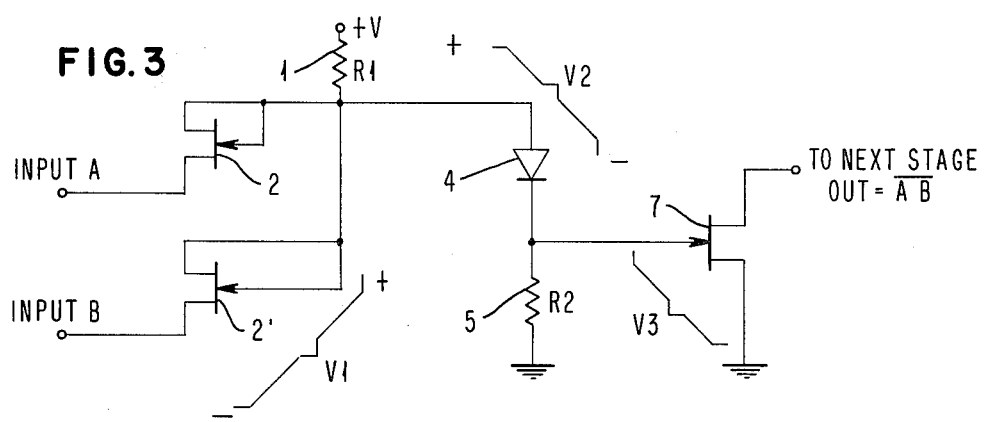
FIG. 3 illustrates an alternate embodiment of the circuit shown in FIG. 2, wherein the function of compensating device 2 is combined with the input diodes 3.

A high performance version of the circuit of FIG. 2 is shown in FIG. 3 using enhancement mode MESFET devices (thresholds greater than zero). The entire circuit is formed on the same semiconductor chip and includes a first enhancement mode MESFET device 2 having its source terminal connected to a first logical input A and its drain and gate terminals connected to a first node. A first impedance 1 is connected between the first node and the first potential +V forming a current source. A second impedance 5 is connected between a second node and a second potential (ground) forming a current sink, with the second node being connected to the first node. A second enhancement mode MESFET device 7 has its gate connected to the second node, its source connected to the second potential, and its drain connected to an output terminal for the circuit. The first enhancement mode MESFET device 2 has substantially the same threshold voltage as the second enhancement mode MESFET device 7 and is formed in mutually close proximity on the semiconductor substrate. In this manner, a logical inverter function can be performed by the circuit with the single input MESFET device 2. In the preferred embodiment, the semiconductor substrate upon which the circuit is formed is gallium arsenide. This circuit can further include a voltage level shifting device 4 which is connected between the first and second nodes, for reducing the low state binary voltage applied to the gate of the second MESFET device 7 to substantially the same magnitude as the low state binary voltage which is applied at the A input of the device 2.

The circuit of FIG. 3 can further comprise a third enhancement mode MESFET device 2' which is formed on the semiconductor substrate, having its source connected to a second logical input B and its drain and gate terminals connected to the first node. In this manner, a NAND logical function can be performed by the circuit.

It is seen that the function of the input diodes 3 and 3' in FIG. 2 are combined with the MESFET device 2 in FIG. 2 to achieve the function performed by the MESFET devices 2 and 2' in FIG. 3.

In interconnecting the circuit of FIG. 3 with other similar circuits to make a larger complex logical function, the output terminal of the circuit in FIG. 3 would be connected to the input terminal of a corresponding circuit so that the impedance $R_1$ of the next stage circuit can be employed as the pull-up resistor or load for the output of the circuit shown in FIG. 3. The compensator MESFET device 2 and the logical input diodes 3 of FIG. 2 are merged and the negative threshold diode 6 of FIG. 2 is removed. For this circuit, a logical zero is below about 0.2 volts while a logical one is above about 1.0 volts. The useful logic swing may be increased by increasing the number of level shift diodes 4 and 4' in the circuit.

The resultant circuits shown in FIGS. 1, 2 and 3 are more tolerant of threshold voltage shifts than have enhancement mode MESFET circuits been in the prior art.

Although specific embodiments of the invention have been disclosed, it will be understood by those of skill in the art that the foregoing and other changes in form and details may be made therein without departing from the spirit and the scope of the invention.

Having thus described our invention, what I claim as new, and desire to secure by Letters Patent is:

1. An integrated circuit logic gate formed on a semiconductor substrate, comprising:
    a first enhancement mode MESFET device having a threshold voltage deviation from a nominal threshold voltage value and having its source terminal connected to a first logical input and its drain and gate terminals connected to a first node;
    a first impedance connected between said first node and the first potential forming a current source;
    a second impedance connected between said first node and a second potential forming a current sink, the resultant voltage at said first node deviating from a nominal first voltage in response to said threshold voltage deviation of said first MESFET device;
    a second enhancement mode MESFET device formed in close proximity to said first MESFET device and having a threshold voltage deviation from said nominal threshold voltage substantially equal to said threshold voltage deviation of said first MESFET device and having its gate connected to said first node, its source connected to said second potential, and its drain connected to an output terminal for the circuit;
    a third impedance connected between said output terminal and said first potential for conducting current to said output node, the resultant voltage at said output node being substantially equal to a nominal output voltage in response to said deviation of said voltage at said first node compensating for the effect of said threshold voltage deviation of said second MESFET device;
    whereby a logical inverter function can be performed by the circuit.

2. The circuit of claim 1, which further comprises:
said semiconductor substrate being formed from gallium arsenide.

3. The circuit of claim 1, which further comprises:
a voltage level shifting device connected between said first node and said gate of said second device, for reducing the low state binary voltage applied to said gate of said second MESFET device to substantially the same magnitude as the low state binary voltage applied to said first logical input.

4. The circuit of claim 1, which further comprises:
a third enhancement mode MESFET device formed on said semiconductor substrate, having its source connected to a second logical input and its drain and gate terminals connected to said first node;
whereby a NAND logical function can be performed by the circuit.

5. The circuit of claim 4, which further comprises:
said substrate being composed of gallium arsenide.

6. The circuit of claim 4, which further comprises:
a voltage level shifting device connected between said first node and said gate of said second device, for reducing the low state binary voltage applied to said gate of said second MESFET device to substantially the same magnitude as the low state binary voltage applied to said first logical input.

7. The circuit of claim 1, which further comprises:
a first input diode having its anode connected to said source of said first enhancement mode MESFET device, and its cathode connected to said first logical input;
a second input diode having its anode connected to said source of said first enhancement mode MESFET device and its cathode connected to a second logical input;
whereby a NAND logical function can be performed by the circuit.

8. The circuit of claim 7, which further comprises:
a voltage level shifting device connected between said first node and gate of said second device, for reducing the low state binary voltage applied to said gate of said second MESFET device to substantially the same magnitude as the low state binary voltage applied to said first logical input.

9. The circuit of claim 8, which further comprises:
negative threshold bias circuit connected between said source of said second enhancement mode MESFET device and said second potential, for applying a negative potential to said source of said second MESFET device.

10. The circuit of claim 9, which further comprises:
a current source connected between said output node and said first potential, for applying a current to said output node.

11. The circuit of claim 9, which further comprises:
  said negative threshold bias circuit being a diode with a cathode connected to said second potential and an anode connected to said source of said second enhancement mode MESFET device.

12. The circuit of claim 8, which further comprises:
  said level shifter being a diode formed in said substrate with an anode connected to said first node and a cathode connected to said gate of said second device.

* * * * *